United States Patent [19]

Schreiber et al.

[11] Patent Number: 5,326,412

[45] Date of Patent: Jul. 5, 1994

[54] METHOD FOR ELECTRODEPOSITING CORROSION BARRIER ON ISOLATED CIRCUITRY

[75] Inventors: Christopher M. Schreiber, Newport Beach; Haim Feigenbaum, Irvine, both of Calif.

[73] Assignee: Hughes Aircraft Company, Los Angeles, Calif.

[21] Appl. No.: 994,801

[22] Filed: Dec. 22, 1992

[51] Int. Cl.[5] .............................................. B32B 31/12
[52] U.S. Cl. ..................................... 156/150; 156/151; 156/233; 156/245; 29/830; 29/846; 29/848; 29/849
[58] Field of Search ................ 156/150, 151, 245, 233; 29/848, 849, 846, 830; 174/261, 262, 250, 255, 259; 204/12; 361/412

[56] References Cited

U.S. PATENT DOCUMENTS

| | | | |
|---|---|---|---|
| 4,116,517 | 9/1978 | Selvin et al. | 339/17 F |
| 4,125,310 | 11/1978 | Reardon, II et al. | 339/92 M |
| 4,125,441 | 11/1978 | Dugan | 204/12 |
| 4,453,795 | 6/1984 | Moulin | 339/92 M |
| 4,813,129 | 3/1989 | Karnezos | 29/832 |

Primary Examiner—Caleb Weston
Attorney, Agent, or Firm—E. E. Leitereg; T. Gudmestad; W. K. Denson-Low

[57] ABSTRACT

A corrosion resistant barrier is provided for isolated circuity. An isolated circuit (10, 12) with raised interconnection features (16, 18) having a corrosion resistant gold coating (34) is formed on a reusable stainless steel mandrel (22) which is provided with indentations to define raised features. A seed layer (32) of copper is electroplated on the mandrel in a pattern of the isolated circuit to be formed. The copper seed layer (32) is then followed by electroplated layers of gold (34), nickel (36) and copper (38) until a total desired conductor thickness is achieved. A dielectric substrate (44, 46) is laminated on the multilayer conductive traces of the circuit. After removal of the multilayer circuit from the mandrel, a predrilled dielectric coverlay (50) is laminated to the circuit with holes in the coverlay receiving the raised circuit features (52). The finished part is then etched to remove the copper seed layer from the raised features.

7 Claims, 2 Drawing Sheets

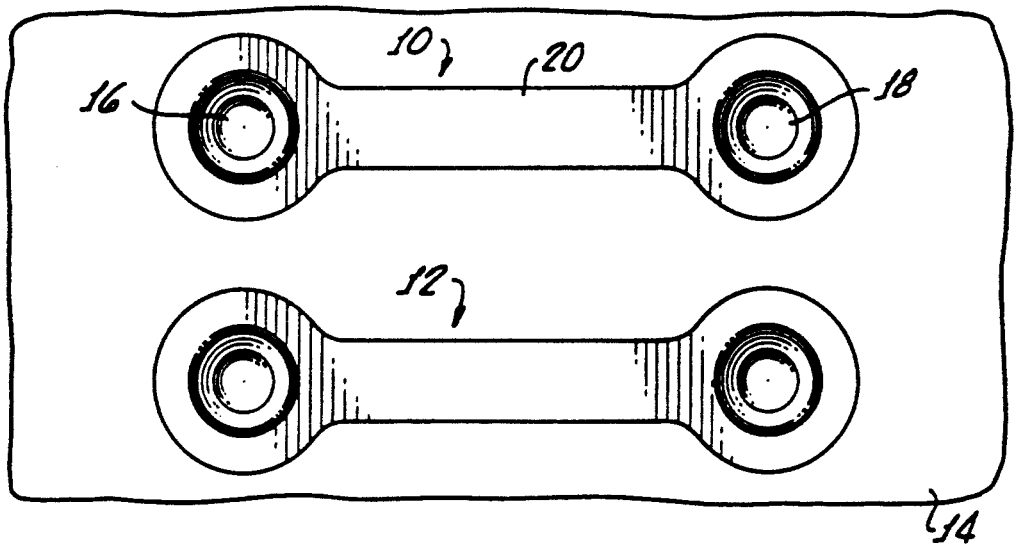
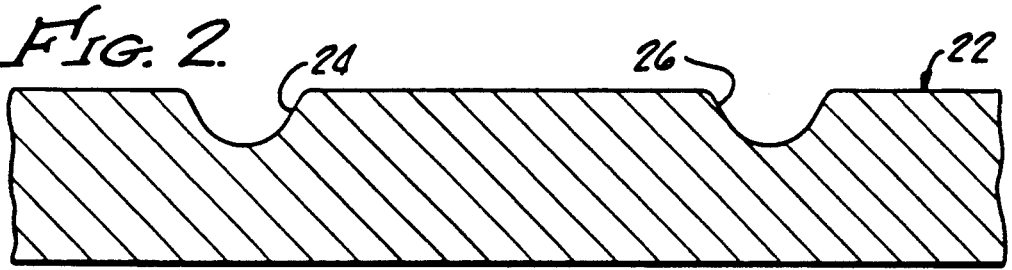
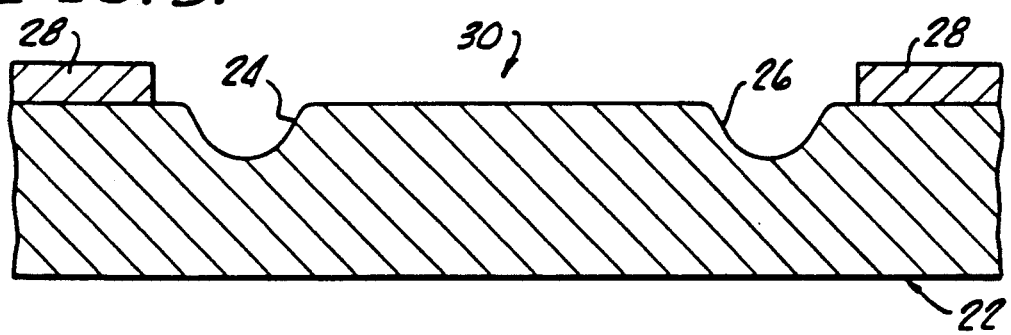
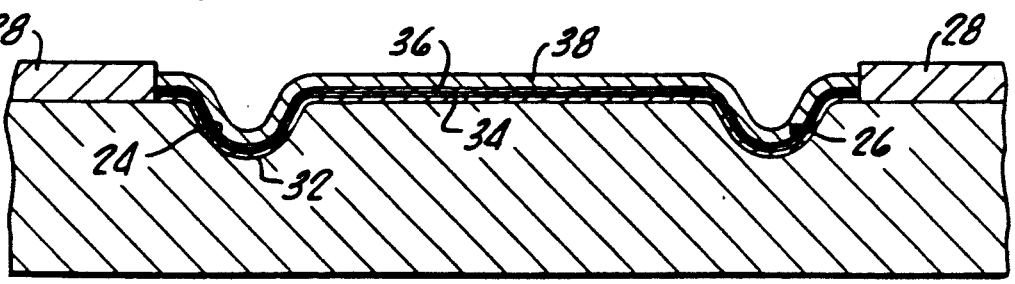

METHOD FOR ELECTRODEPOSITING CORROSION BARRIER ON ISOLATED CIRCUITRY

BACKGROUND OF THE INVENTION

1. Field of the Invention

The present invention relates to the manufacture of electrical circuitry and more particularly concerns the method of attaining a corrosion resistant barrier upon isolated areas of electrical circuitry by employing a reusable mandrel.

2. Description of Related Art

Many different types of printed circuits employ gold or other corrosive resistant coatings on exposed conductive surfaces, among such circuits are those having projecting connective elements. Such connective elements are used in printed circuits that are connected to one another by projecting elements in the form of metallic interconnection features that are pressed against similar projecting features or mating metallic connecting pads on the other circuit components. Flexible circuit terminations and connecting wafers of this type are described in U.S. Pat. No. 4,125,310 to Patrick A. Reardon II, U.S. Pat. No. 4,116,517 to Selvin et al. and U.S. Pat. No. 4,453,795 to Moulin. For, many applications, whether or not projecting connective features are used it is required that exposed circuitry and, particularly the raised connection features on the circuitry be coated with a corrosion resistant material such as gold. Electroless gold plating results in a porous surface that is incapable of providing effective corrosion resistance. Additionally, the purity of the gold is inferior to electrodeposited gold due to the co-deposition of the reducing agent in the electroless solution. Accordingly, electrodeposition is employed to achieve non-porous corrosion barriers. To electroplate a raised feature an electrical connection is made to the feature, frequently by means of a lead that extends to the edge of the circuit part where plating current is provided. However, in some instances the circuit is isolated, that is, it has no electrical connection to edges of the part on which it is mounted. Accordingly, it is common, when corrosion plating isolated raised features, to form an additional conductive path from the feature to the periphery of the part to provide a path to be used solely for electroplating current. Once the gold plating is completed, this conductive path has no use. Nevertheless, after cutting the part to final dimensions, this conductive plating path remains and provides a path for possible future shorting because it forms a bare lead at the edge of the product. Another disadvantage of the use of these conductive plating paths is the fact that they require area on the surface of the part which may be more efficiently used for functional circuit traces.

Accordingly, it is an object of the present invention to provide a corrosion resistant coating on an isolated circuit in a manner that minimizes or avoids problems of the prior art.

SUMMARY OF THE INVENTION

In carrying out principles of the present invention in accordance with a preferred embodiment thereof, a reusable conductive mandrel has a suitable pattern of depressions formed therein and is then coated with an electrically non-conductive material to define a pattern of the isolated circuit that is to be made. Successive layers of a seed copper, gold, nickel and a primary conductive copper are electroplated on the mandrel in the pattern of the desired circuit which is then laminated to a dielectric substrate, which may be formed of an adhesive epoxy, polyimide or combination thereof. The mandrel is separated from the circuit and a predrilled dielectric coverlay is laminated to the circuit with holes in the coverlay receiving the raised features of the circuit. The circuit is then exposed to an etching bath to remove solely the seed copper layer from the exposed ends of the raised features.

BRIEF DESCRIPTION OF THE DRAWINGS

FIG. 1 is a top view of a fragment of an isolated circuit element illustrating simple isolated circuits thereon.

FIG. 2 illustrates a stainless steel mandrel employed in the practice of the present invention.

FIGS. 3 through 6 illustrate various steps in a method of producing a corrosion coated isolated circuit.

DESCRIPTION OF THE PREFERRED EMBODIMENTS

Figure 5:
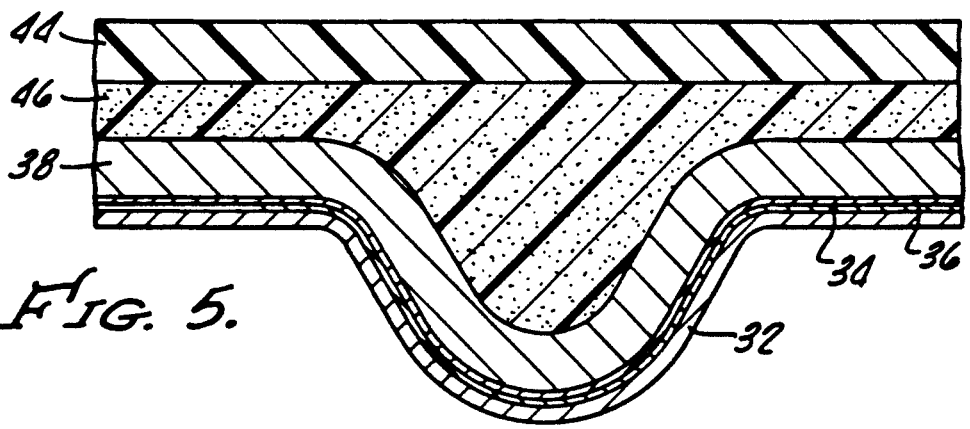
Figure 6:
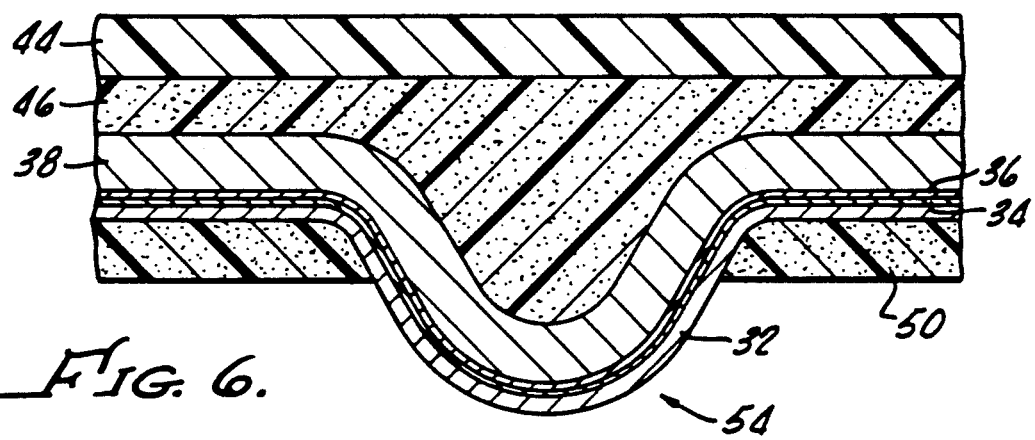

FIG. 1 is a greatly simplified illustration of a pair of isolated circuits 10, 12 on a circuit substrate 14, illustrating an arrangement wherein the isolated circuits have no circuit connections to any peripheral part of the circuit board 14. The circuits illustrated may be identical and each comprises a conductive raised feature 16 connected to a second conductive raised feature 18 by an interconnecting electrical conductor or trace 20. In an illustrated embodiment of the present invention, the circuits 10 and 12 are made by a novel process on a reusable mandrel to provide corrosion coating of the surfaces of the raised features 16 and 18 during the circuit formation and without the necessity of providing any special electroplating leads that are nonfunctional in operation of the circuit.

Any of the fully or semi-additive methods described in co-pending applications Ser. No. 07/580,758, filed Sep. 11, 1990, for Three-Dimensional Electroformed Circuitry of William R. Crumly Christopher M. Schreiber and Haim Feigenbaum; Ser. No. 07/580,749, filed Sep. 11, 1990, for Laser Pattern Ablation of Fine Line Circuitry Masters of Christopher M. Schreiber and William R. Crumly; Ser. No. 07/S80,748, filed Sep. 11, 1990, for Apparatus and Method Using a Permanent Mandrel for Manufacture of Electrical Circuitry of Mark A. Souto and Christopher M. Schreiber; and Ser. No. 07/674,254, filed Mar. 25, 1991 for Interconnection of Opposite Sides of a Circuit Board of Christopher M. Schreiber, William R. Crumly and Robert B. Hanley; (all assigned to the assignee of the present application), may also be employed to form the corrosion barrier. The disclosures of each of these applications are incorporated herein by this reference as though fully set forth. In general, these prior applications disclose use of a conductive mandrel formed with depressions or projections to fabricate circuits having conductive traces and raised features or bumps electroformed, as by electroplating for example, directly on the mandrel.

FIGS. 2 through 6 correspond to longitudinal sections through circuit 10, from feature 16 to feature 18, of FIG. 1 during various steps in an exemplary process of forming a circuit. Although the laser ablation process of the above identified patent application Ser. No. 07/580,749 is described herein, any one of the mandrel based additive methods of any of the above identified patent applications may be used. As shown in FIG. 2, an electrically conductive mandrel 22 is formed, for example, of a thin plate of stainless steel and provided with a pattern of circuit elements that correspond to areas of a circuit that are to be provided with a corrosion resistant barrier. In the example illustrated in the drawings the mandrel circuit elements are depressions 24,26 which will result in defining raised features of one of the circuits. Elements or depressions 24,26 are formed in the surface of the stainless steel by various techniques such as, for example, etching, electron discharge machining or mechanical deformation, using a punch or the like, or some combination thereof. In a laser ablation mandrel process, the entire surface of the mandrel is coated with electrically non-conductive material, such as Teflon 28 (FIG. 3) that is then selectively removed by laser ablation as described in above identified patent application Ser. No. 07/580,749. This leaves a positive pattern 30 of exposed mandrel surface corresponding to the shape of the circuit to be formed, and including depressions 24,26. A seed layer 32 (FIG. 4) of copper is then electrodeposited, as by electroplating, on areas of the mandrel, not covered by the Teflon 28. The seed layer 32 has a thickness considerably less then the total circuit thickness and may, for example, have the thickness of 0.002 inches. Thereafter, as illustrated in FIG. 4, successive layers of gold 34, nickel 36 and finally copper 38 are electrolytically plated in the exposed circuit pattern defined by the Teflon 28 until the total desired conductor thickness is achieved. Thus, for example, a gold layer 34 of approximately 0.00005 inches thickness may be deposited, followed by a layer 36 of nickel of approximately 0.00005 inches and finally the copper layer 38 which may have a thickness of 0.001 inches.

After electrodepositing the various conductor layers, a circuit substrate in the form of a thin flexible dielectric coated with an adhesive is then laminated to the circuit (FIG. 5). For example, a polyimide such as a 2 mil layer of Kapton 44 coated with a 1 mil layer of an acrylic adhesive 46 is then laminated directly on the outer most copper layer 38. Preferably the substrate is applied while the circuit is still on the mandrel. The substrate is shown in FIG. 5 which also shows the separation of the partly completed circuit, as a unit, from the mandrel and its Teflon pattern. After application of the substrate, the circuit 22 is parted from the mandrel. The mandrel with its Teflon pattern is ready for reuse in the fabrication of additional similar circuits.

Figure 7:
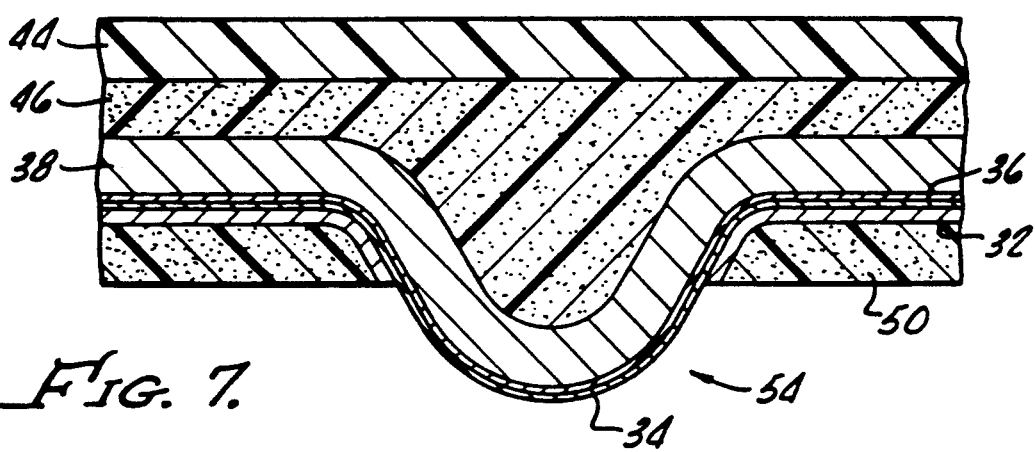
FIG. 7 illustrates the resultant part.

After lamination of the substrate 44, 46 to the circuit and removal from the mandrel, a predrilled coverlay 50 (FIG. 6) is laminated to the other surface of the circuit, over the projecting features 52, 54 of the circuit. The coverlay is a dielectric sheet formed of a material with insulative properties, such as a polyimide coated with an acrylic adhesive. The coverlay has holes predrilled therein in a pattern that registers with the pattern of raised features 52, 54 of the circuit. The coverlay holes are aligned with the raised features and the coverlay then is laminated to the circuit with the raised features entering and projecting through the predrilled holes of the coverlay. At this time, the seed copper layer 32 still covers the exterior of the raised features. Now the entire part with its laminated coverlay 50 is immersed in a suitable etching bath, such as a cupric chloride etching solution, to etch away solely the seed copper layer 32 where it is exposed through the predrilled holes of the coverlay 50. The resulting completed part is illustrated in FIG. 7 and comprises isolated circuitry having raised conductive features 52, 54 of which the outermost surface is formed by the electrodeposited gold layer 34. Thus, the finished circuit is provided as a flexible substrate or flexible tape in which are formed one or more patterns of isolated circuitry, which, of course, may include some circuit components or some circuit elements and traces that are not isolated.

The use of the copper seed layer facilitates separation of the circuit and substrate from the mandrel (permits the substrate 44, 46 to be applied to the circuitry while it is still on the mandrel and prevents the adhesive 46 of the substrate from adhering to the mandrel surface when the latter is removed from the circuit).

Although the invention has been described as applied to corrosion coating on an isolated raised circuit feature, it will be readily understood that it is fully applicable to other types of isolated circuit elements. The described corrosion resistant method and materials may be applied to a circuit element that has a pre-cleared or drilled area in the top insulation layer. Described methods are also applicable to bare chip on circuit board applications where wires as small as 0.001 inches are ultrasonically boned (wire bonded, TAB bonded, or attached using conductive epoxies as in a flip-chip process) between the chip pads and board contacts.

In addition to nickel-gold corrosion barriers, Palladium and Iridium metalizations may be used.

The described method for forming corrosion coated isolated circuitry is a simple, primarily additive process employing rapid and inexpensive techniques and a simply formed mandrel that is reusable for replication of many circuits.

What is claimed is:

1. A method for forming corrosion resistant isolated circuitry comprising the steps of:
    forming a conductive mandrel having a pattern of circuit elements therein, said pattern including a plurality of depressions extending below the surface of the mandrel and also including areas of the surface joining said depressions,
    coating the mandrel with a nonconductive material having a pattern defining a circuit to be formed, said circuit including features corresponding to said circuit elements,
    plating a series of layers of electrically conductive material on said mandrel in said pattern, said layers being plated in said depression and on said surface areas, one of said layers adjacent said mandrel being a corrosion resistant material, and
    separating the plated layers from the mandrel to provide a corrosion resistant isolated circuit having features corresponding to said circuit elements and to enable reuse of the mandrel to form additional corrosion resistant isolated circuitry.

2. The method of claim 1 including the steps of reusing the mandrel to make another corrosion resistant isolated circuit.

3. A method for forming corrosion resistant isolated circuitry comprising the steps of:
    forming a conductive mandrel having a pattern of circuit elements therein,
    coating the mandrel with a nonconductive material having a pattern defining a circuit to be formed, said circuit including said circuit elements,
    plating a series of layers of electrically conductive material on said mandrel in said pattern, one of said layers adjacent said mandrel being a corrosion resistant material, and separating the plated layers from the mandrel to provide a corrosion resistant isolated circuit having features corresponding to said circuit elements and to enable reuse of the mandrel to form additional corrosion resistant isolated circuitry, said step of plating layers comprising initially plating a seed layer of copper upon said mandrel, and including the step of removing at least portions of said seed layer after the plated layers are separated from the mandrel.

4. The method of claim 3 including the step of laminating a dielectric substrate to the last one of the layers plated upon said mandrel, said step of separating comprising separating said substrate and plated layers as a unit from said mandrel.

5. The method of claim 4 wherein said circuit elements are depressions and said features are raised features, and including the step of providing a dielectric coverlay having a plurality of holes formed therein in a pattern matching the pattern of the circuit elements in said mandrel and the features of said circuit, laminating said dielectric coverlay to said plated layers after separating said layers, and positioning the coverlay with the raised features received in respective holes of the coverlay.

6. The method of claim 5 wherein said step of plating layers of material on said mandrel includes the step of first plating a seed layer on said mandrel and then plating a layer of gold on the mandrel, and including the step of removing said seed layer of copper from said raised features after said dielectric coverlay is applied to said circuit.

7. A method of forming an isolated circuit having corrosion resistant coated raised features thereon comprising the steps of:

forming a reusable stainless steel mandrel having a pattern of depressions therein for defining raised features of a circuit to be formed, coating said mandrel with a nonconductive material formed in a pattern that selectively exposes surface areas of the mandrel, including said depressions, in a pattern that corresponds to a circuit pattern to be formed thereon, said circuit pattern including raised features corresponding to said mandrel depressions, electroplating a seed layer of copper on said exposed mandrel surface, electroplating a layer of gold on said seed layer of copper, electroplating a layer of nickel on said layer of gold, electroplating a layer of copper on said layer of nickel, laminating a dielectric substrate to said last mentioned layer of copper, separating said mandrel from said deposited layers to provide a multilayer conductive circuit, forming a dielectric coverlay with a pattern of holes conforming to said pattern of raised features, laminating said dielectric coverlay to said conductive circuit with said raised features received in said holes, and removing said seed layer of copper from said raised features after said dielectric coverlay is laminated to said conductive circuit.

* * * * *